US011557511B2

(12) United States Patent
Huang et al.

(10) Patent No.: US 11,557,511 B2
(45) Date of Patent: Jan. 17, 2023

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Hsin-Yen Huang, New Taipei (TW); Ting-Ya Lo, Hsinchu (TW); Shao-Kuan Lee, Kaohsiung (TW); Chi-Lin Teng, Taichung (TW); Cheng-Chin Lee, Taipei (TW); Hsiaokang Chang, Hsinchu (TW); Shau-Lin Shue, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 83 days.

(21) Appl. No.: 17/146,821

(22) Filed: Jan. 12, 2021

(65) Prior Publication Data
US 2022/0223465 A1    Jul. 14, 2022

(51) Int. Cl.
*H01L 21/768* (2006.01)
*H01L 23/522* (2006.01)
*H01L 23/532* (2006.01)

(52) U.S. Cl.
CPC .... *H01L 21/7682* (2013.01); *H01L 21/76834* (2013.01); *H01L 21/76837* (2013.01); *H01L 21/76841* (2013.01); *H01L 21/76885* (2013.01); *H01L 23/5226* (2013.01); *H01L 23/53295* (2013.01); *H01L 23/53209* (2013.01); *H01L 23/53223* (2013.01); *H01L 23/53238* (2013.01); *H01L 23/53252* (2013.01); *H01L 23/53266* (2013.01)

(58) Field of Classification Search
CPC ........... H01L 21/7682; H01L 21/76834; H01L 21/76837; H01L 21/76841; H01L 21/76885; H01L 23/5226; H01L 23/53295; H01L 23/53209; H01L 23/53223; H01L 23/53238; H01L 23/53252; H01L 23/53266
See application file for complete search history.

(56) References Cited

U.S. PATENT DOCUMENTS

| 9,105,490 B2 | 8/2015 | Wang et al. |
| 9,236,267 B2 | 1/2016 | De et al. |
| 9,236,300 B2 | 1/2016 | Liaw |

(Continued)

*Primary Examiner* — Karen Kusumakar
(74) *Attorney, Agent, or Firm* — NZ Carr Law Office, PLLC

(57) ABSTRACT

An interconnection structure, along with methods of forming such, are described. The structure includes a dielectric layer, a first conductive feature disposed in the dielectric layer, and a conductive layer disposed over the dielectric layer. The conductive layer includes a first portion and a second portion adjacent the first portion, and the second portion of the conductive layer is disposed over the first conductive feature. The structure further includes a first barrier layer in contact with the first portion of the conductive layer, a second barrier layer in contact with the second portion of the conductive layer, and a support layer in contact with the first and second barrier layers. An air gap is located between the first and second barrier layers, and the dielectric layer and the support layer are exposed to the air gap.

20 Claims, 10 Drawing Sheets

(56) References Cited

U.S. PATENT DOCUMENTS

| | | |
|---|---|---|
| 9,406,804 B2 | 8/2016 | Huang et al. |
| 9,431,294 B2 * | 8/2016 | He ................... H01L 21/0217 |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |

* cited by examiner

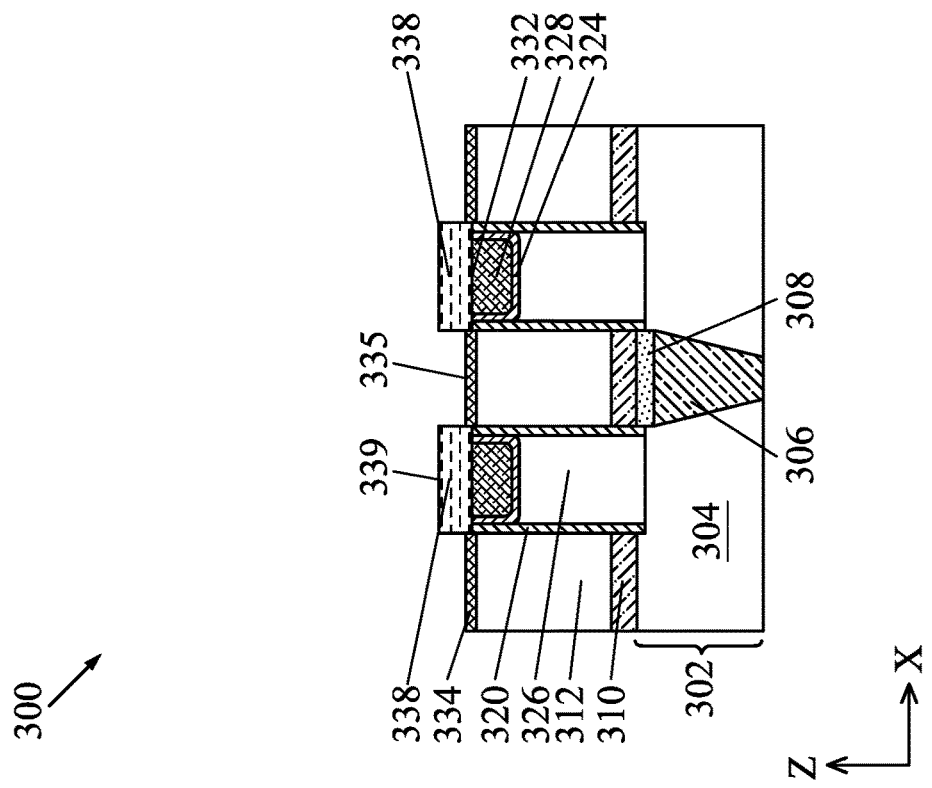
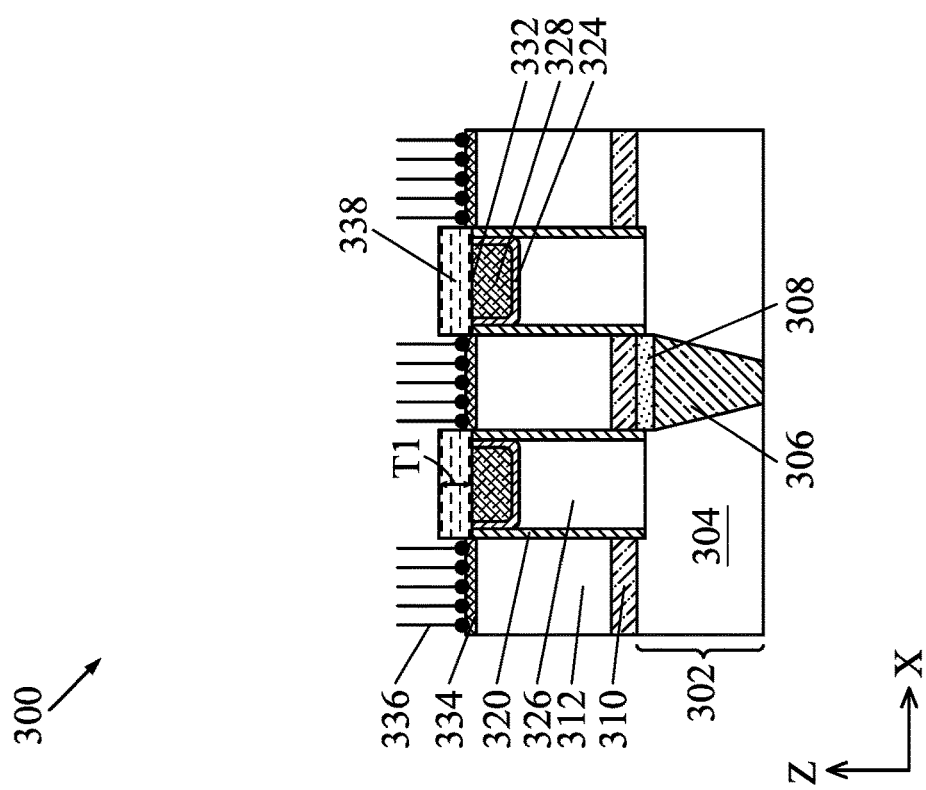
Fig. 2M
Fig. 2N

SEMICONDUCTOR DEVICE STRUCTURE AND METHODS OF FORMING THE SAME

BACKGROUND

As the semiconductor industry introduces new generations of integrated circuits (IC) having higher performance and more functionality, the density of the elements forming the ICs increases, while the dimensions, sizes and spacing between components or elements are reduced. In the past, such reductions were limited only by the ability to define the structures photo-lithographically, device geometries having smaller dimensions created new limiting factors. For example, for any two adjacent conductive features, as the distance between the conductive features decreases, the resulting capacitance (a function of the dielectric constant (k value) of the insulating material divided by the distance between the conductive features) increases. This increased capacitance results in increased capacitive coupling between the conductive features, increased power consumption, and an increase in the resistive-capacitive (RC) time constant.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
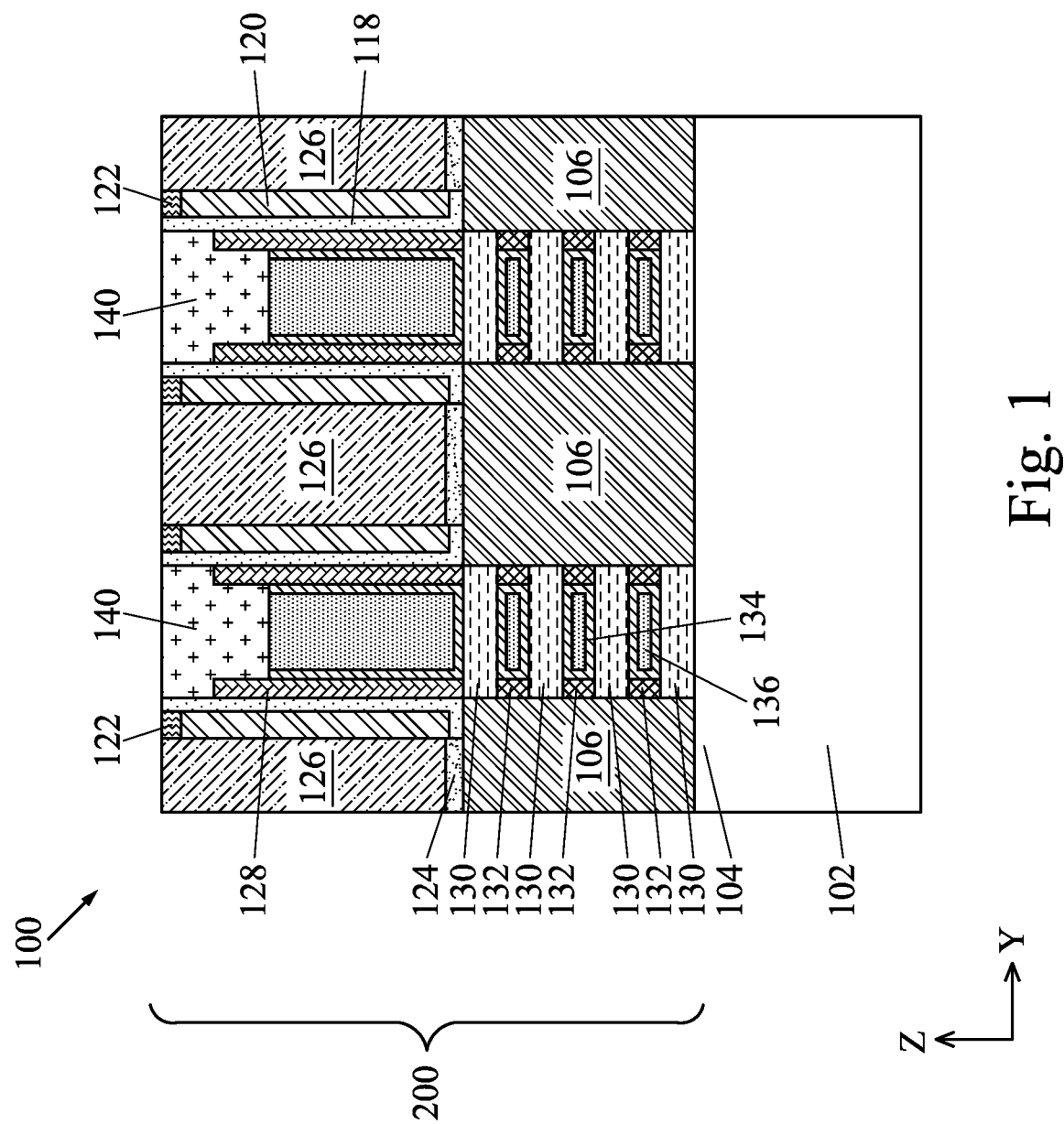
FIG. 1 is a cross-sectional side view of the stage of manufacturing the semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a stage of manufacturing a semiconductor device structure 100. As shown in FIG. 1, the semiconductor device structure 100 includes a substrate 102 having substrate portions 104 extending therefrom and source/drain (S/D) epitaxial features 106 disposed over the substrate portions 104. The substrate 102 may be a semiconductor substrate, such as a bulk silicon substrate. In some embodiments, the substrate 102 may be an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; other suitable materials; or combinations thereof. Possible substrates 102 also include a silicon-on-insulator (SOI) substrate. SOI substrates are fabricated using separation by implantation of oxygen (SIMOX), wafer bonding, and/or other suitable methods. The substrate portions 104 may be formed by recessing portions of the substrate 102. Thus, the substrate portions 104 may include the same material as the substrate 102. The substrate 102 and the substrate portions 104 may include various regions that have been suitably doped with impurities (e.g., p-type or n-type impurities). The dopants are, for example boron for a p-type field effect transistor (PFET) and phosphorus for an n-type field effect transistor (NFET). The S/D epitaxial features 106 may include a semiconductor material, such as Si or Ge, a III-V compound semiconductor, a II-VI compound semiconductor, or other suitable semiconductor material. Exemplary S/D epitaxial features 106 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D epitaxial features 106 may include p-type dopants, such as boron; n-type dopants, such as phosphorus or arsenic; and/or other suitable dopants including combinations thereof.

As shown in FIG. 1, S/D epitaxial features 106 may be connected by one or more semiconductor layers 130, which may be channels of a FET. In some embodiments, the FET is a nanosheet FET including a plurality of semiconductor layers 130, and at least a portion of each semiconductor layer 130 is wrapped around by a gate electrode layer 136. The semiconductor layer 130 may be or include materials such as Si, Ge, SiC, GeAs, GaP, InP, InAs, InSb, GaAsP, AlInAs, AlGaAs, InGaAs, GaInP, GaInAsP, or other suitable material. In some embodiments, each semiconductor layer 130 is made of Si. The gate electrode layer 136 includes one or more layers of electrically conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. In some embodiments, the gate electrode layer 136 includes a metal. A gate dielectric layer 134 may be disposed between the gate electrode layer 136 and the semiconductor layers 130. The gate dielectric layer 134 may include two or more layers, such as an interfacial layer and a high-k dielectric layer. In some embodiments, the interfacial layer is an oxide layer, and the high-k dielectric layer includes hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HMO), hafnium titanium oxide (HfTiO), lanthanum oxide (LaO), aluminum oxide (AlO), aluminum silicon oxide (AlSiO), zirconium oxide (ZrO), titanium oxide (TiO), tantalum oxide (Ta$_2$O$_5$), yttrium oxide (Y$_2$O$_3$), silicon oxynitride (SiON), hafnium dioxide-alumina (HfO$_2$—Al$_2$O$_3$) alloy, or other suitable high-k materials.

The gate dielectric layer 134 and the gate electrode layer 136 may be separated from the S/D epitaxial features 106 by inner spacers 132. The inner spacers 132 may include a dielectric material, such as SiON, SiCN, SiOC, SiOCN, or SiN. Spacers 128 may be disposed over the plurality of semiconductor layers 130. The spacers 128 may include a dielectric material such as silicon oxide, silicon nitride, silicon carbide, silicon oxynitride, SiCN, silicon oxycarbide, SiOCN, and/or combinations thereof. In some embodiments, a self-aligned contact (SAC) layer 140 is formed over the spacers 128, the gate dielectric layer 134, and the gate electrode layer 136, as shown in FIG. 1. The SAC layer 140 may include any suitable material such as SiO, SiN, SiC, SiON, SiOC, SiCN, SiOCN, AlO, AlON, ZrO, ZrN, or combinations thereof.

A contact etch stop layer (CESL) 118 and an interlayer dielectric (ILD) layer 120 are disposed over the S/D epitaxial features 106, as shown in FIG. 1. The CESL 118 may include an oxygen-containing material or a nitrogen-containing material, such as silicon nitride, silicon carbon nitride, silicon oxynitride, carbon nitride, silicon oxide, silicon carbon oxide, the like, or a combination thereof. The materials for the ILD layer 120 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. A cap layer 122 may be disposed on the ILD layer 120, and the cap layer 122 may include a nitrogen-containing material, such as SiCN.

Conductive contacts 126 may be disposed in the ILD layer 120 and over the S/D epitaxial features 106, as shown in FIG. 1. The conductive contacts 126 may include one or more electrically conductive material, such as Ru, Mo, Co, Ni. W, Ti, Ta, Cu, Al, TiN and TaN. Silicide layers 124 may be disposed between the conductive contacts 126 and the S/D epitaxial features 106.

As shown in FIG. 1, the semiconductor device structure 100 may include the substrate 102 and a device layer 200 disposed over the substrate 102. The device layer 200 may include one or more devices, such as transistors, diodes, imaging sensors, resistors, capacitors, inductors, memory cells, combinations thereof, and/or other suitable devices. In some embodiments, the device layer 200 includes transistors, such as nanosheet FET having a plurality of channels wrapped around by the gate electrode layer, as described above. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The nanosheet channel(s) of the semiconductor device structure 100 may be surrounded by the gate electrode layer. The nanosheet transistors may be referred to as nanowire transistors, gate-all-around (GAA) transistors, multi-bridge channel (MBC) transistors, or any transistors having the gate electrode layer surrounding the channels. In some embodiments, the device layer 200 includes planar FET, FinFET, complementary FET (CFET), forksheet FET, or other suitable devices.

Figure 2B:
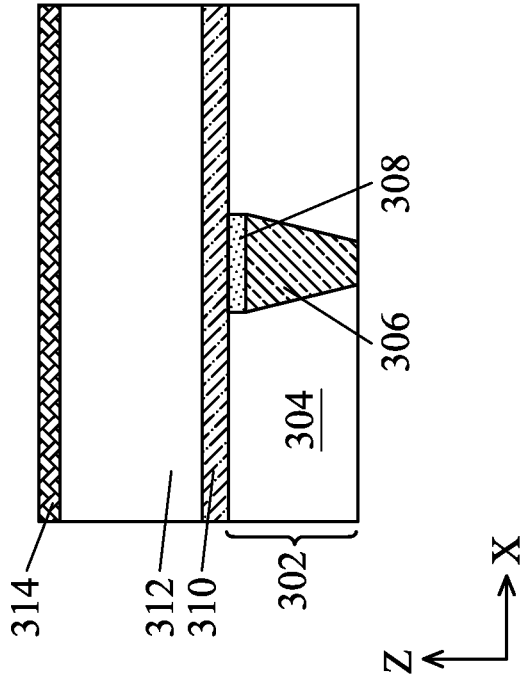
FIGS. 2A-2R are cross-sectional side views of various stages of manufacturing an interconnection structure, in accordance with some embodiments.
Figure 2A:
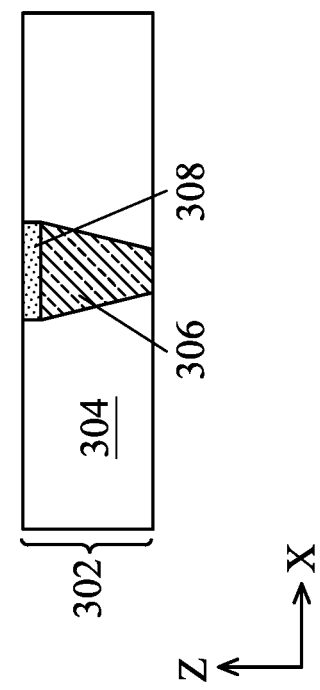
Figure 2D:
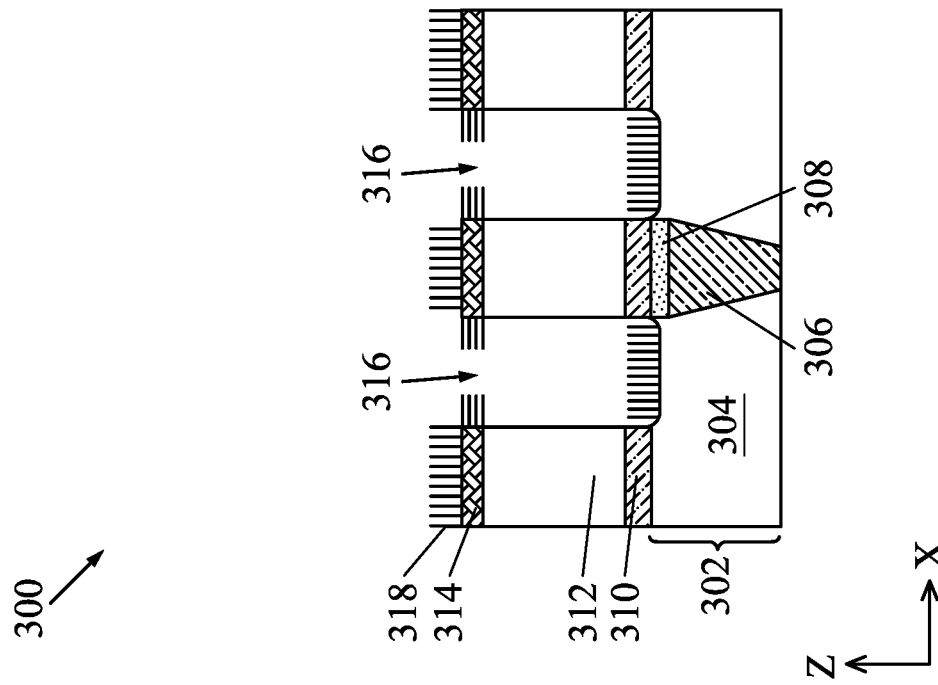
Figure 2C:
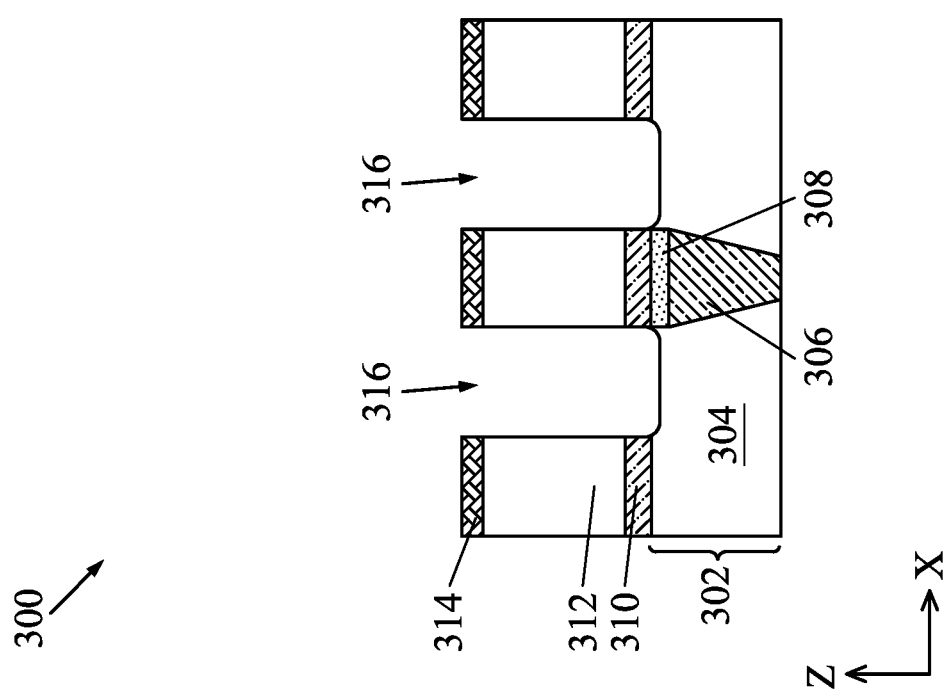
Figure 2F:
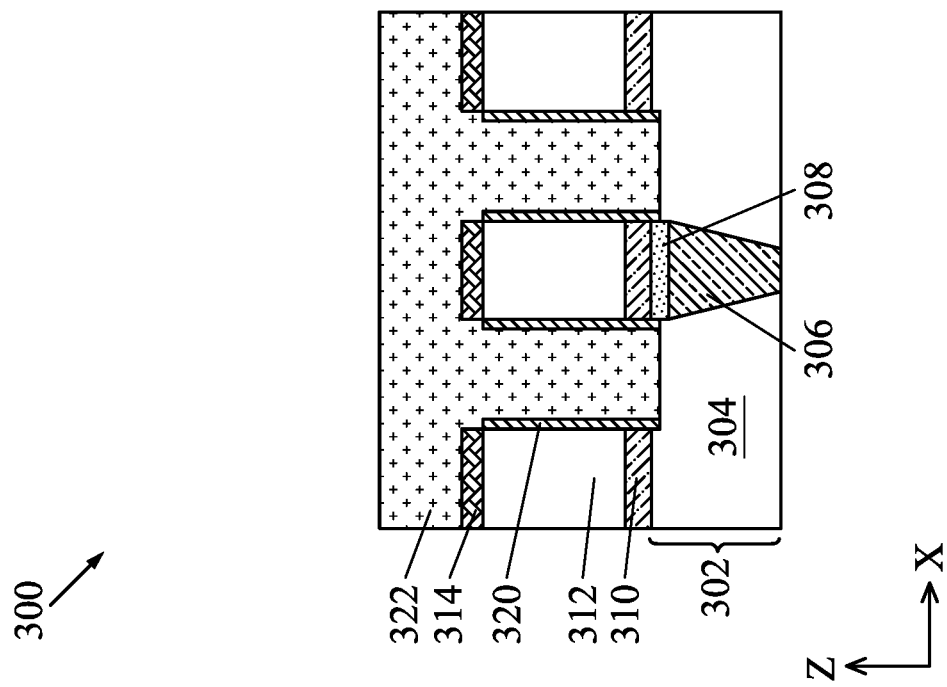
Figure 2E:
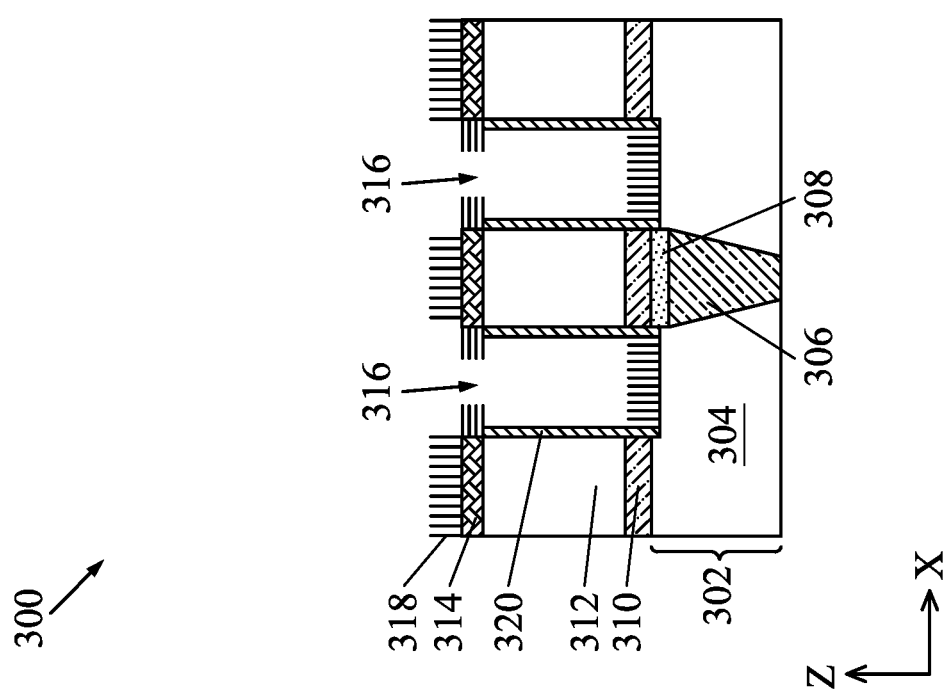
Figure 2G:
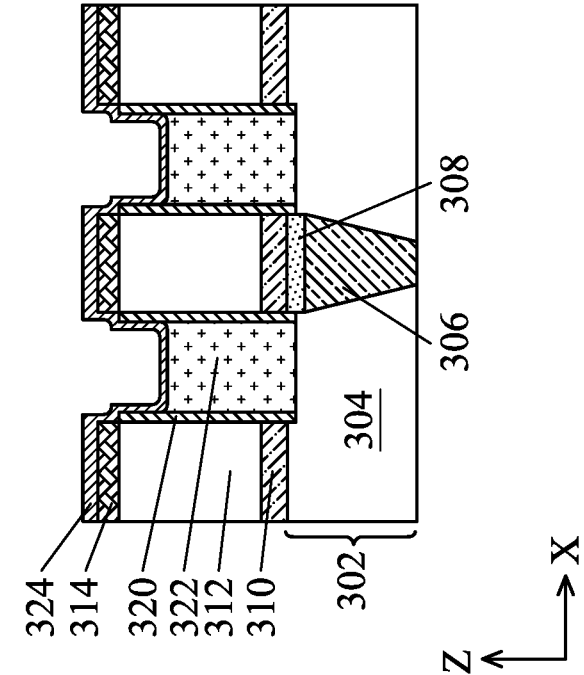
Figure 2H:
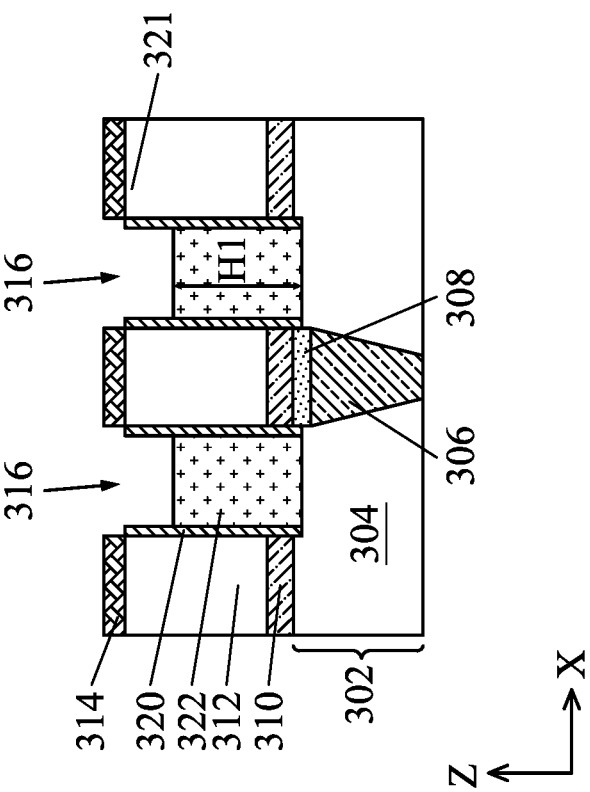
Figure 2J:
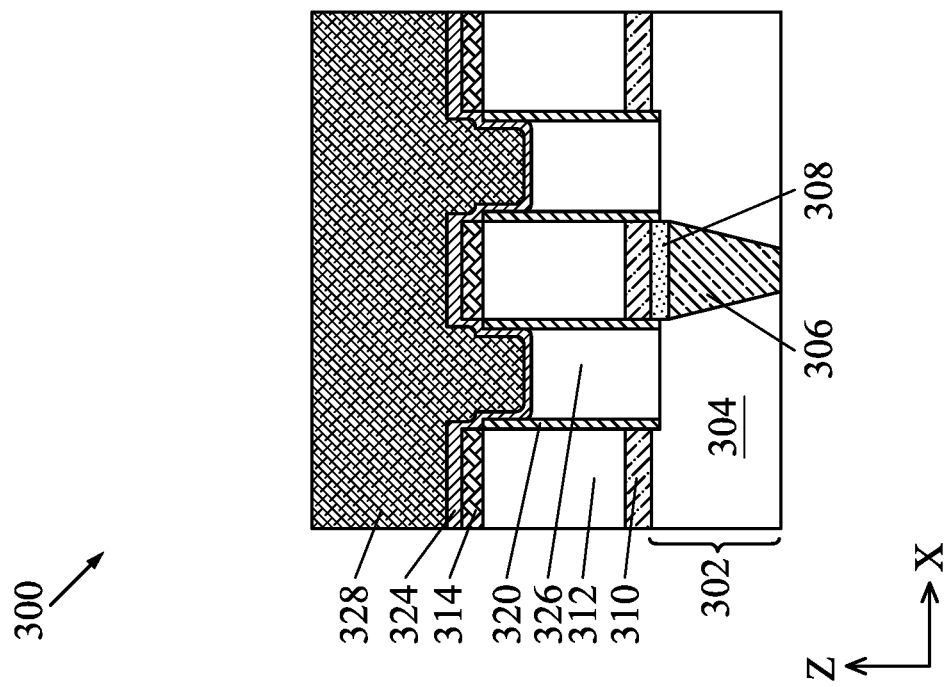
Figure 2I:
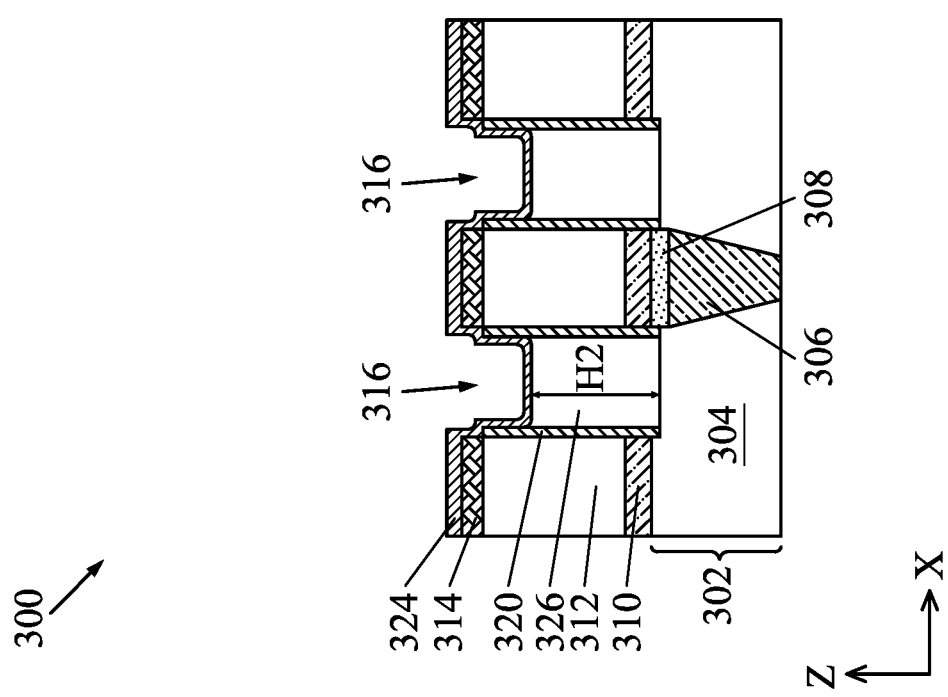
Figure 2L:
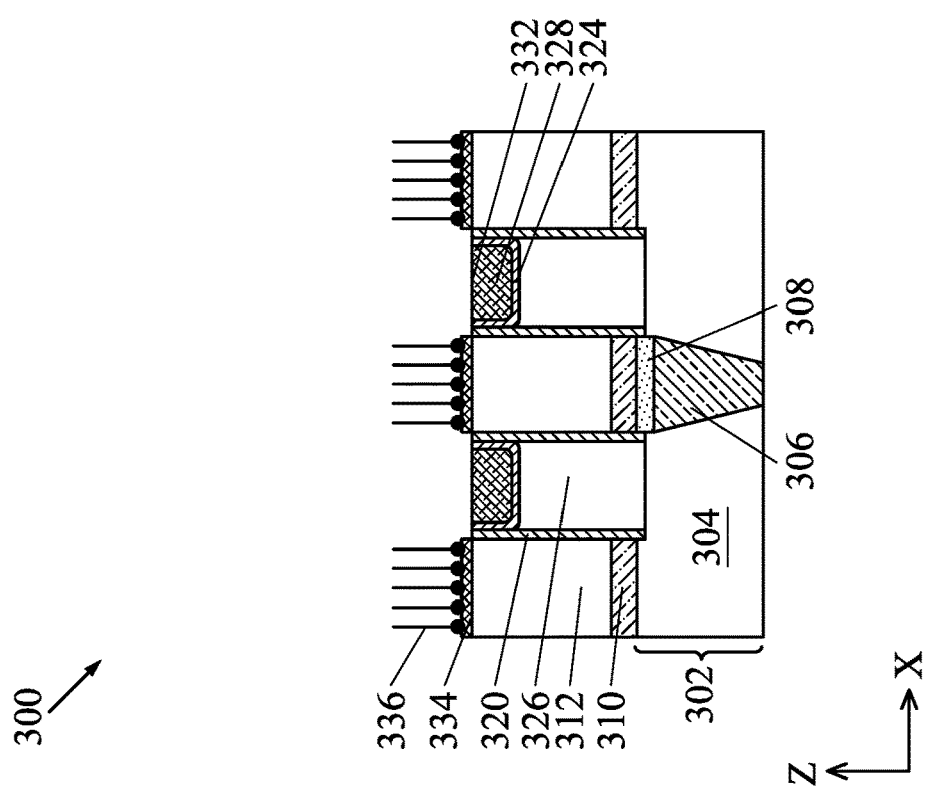
Figure 2K:
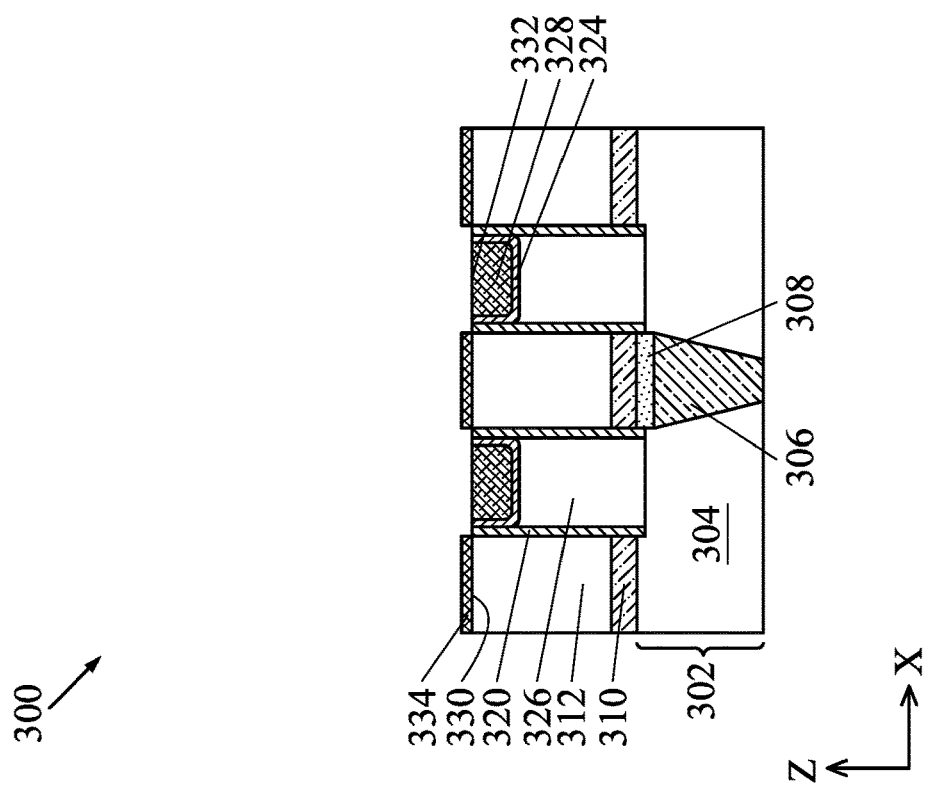
Figure 2P:
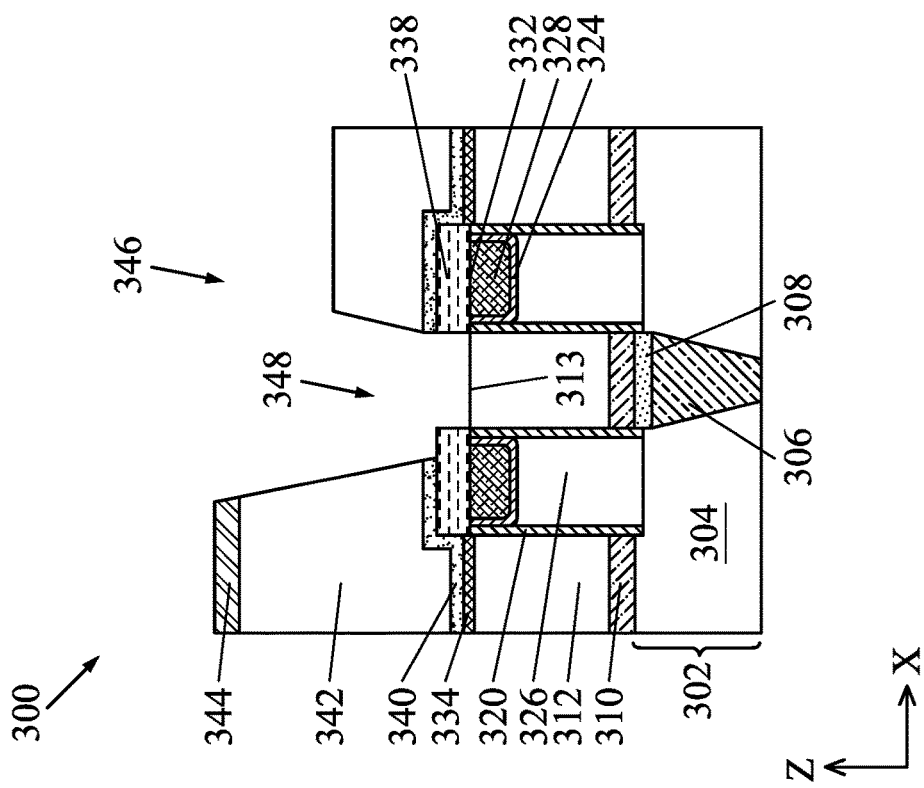
Figure 2O:
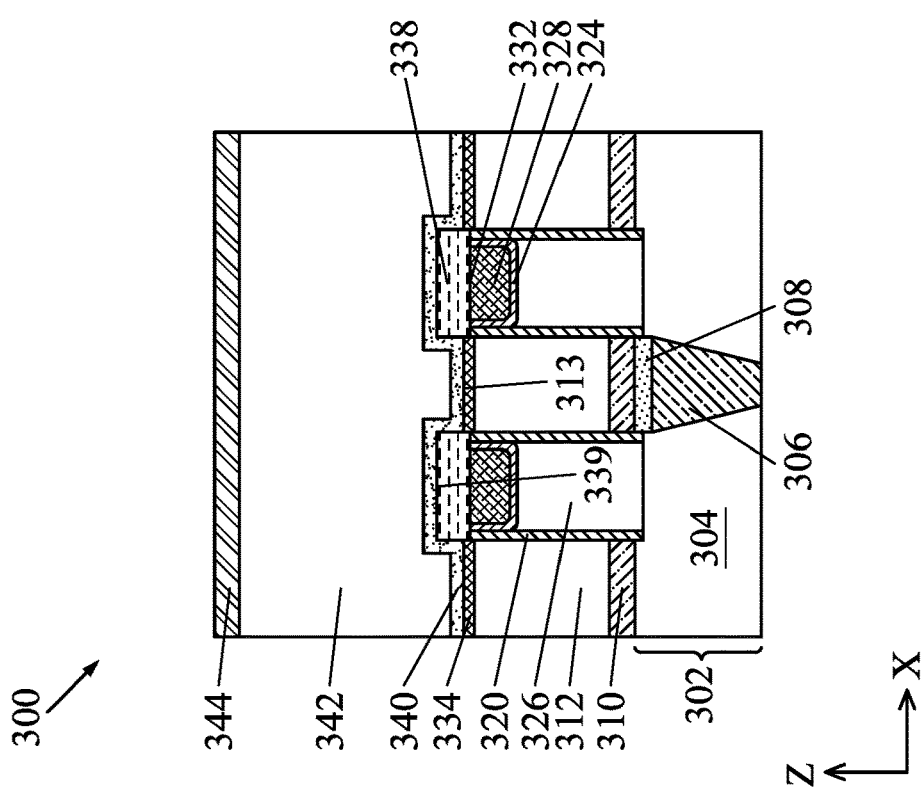
Figure 2R:
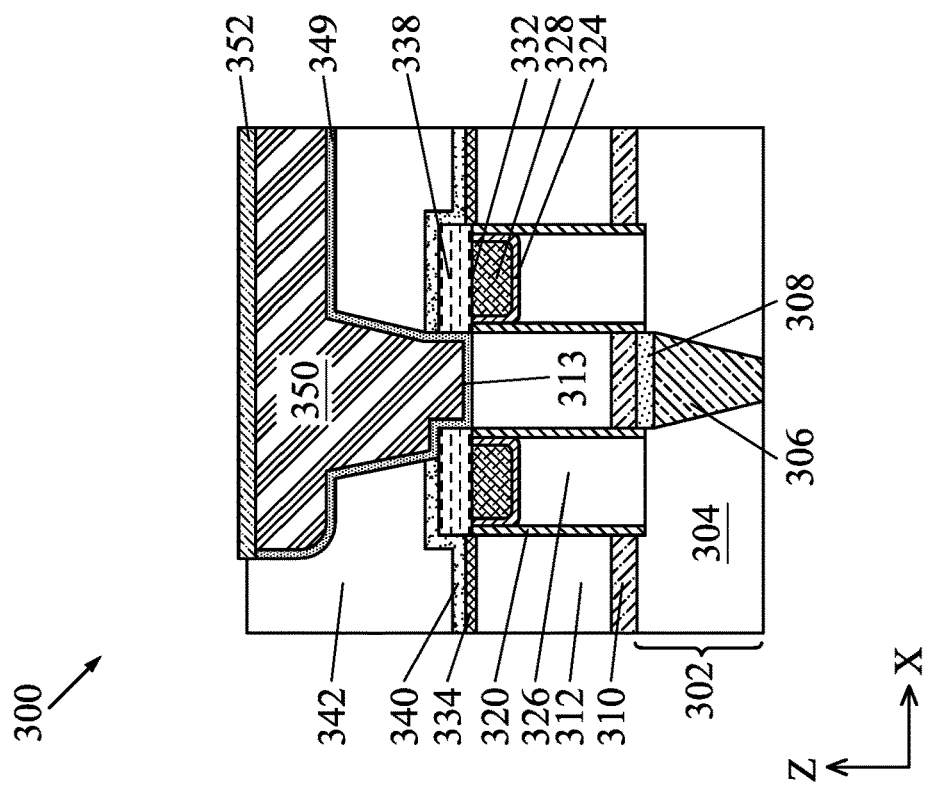

FIGS. 2A-2R are cross-sectional side views of various stages of manufacturing an interconnection structure 300, in accordance with some embodiments. As shown in FIG. 2A, the interconnection structure 300 includes a layer 302, which may be an ILD layer or an intermetal dielectric (IMD) layer. In some embodiments, the layer 302 may be disposed over the ILD layer 120 (FIG. 1). In some embodiments, the layer 302 may be disposed on the cap layer 122 (FIG. 1). The layer 302 includes a dielectric layer 304, one or more conductive features 306 (only one is shown) disposed in the dielectric layer 304, and an optional cap layer 308 disposed on each conductive feature 306. The dielectric layer 304 may include the same material as the insulating material 108. In some embodiments, the dielectric layer 304 includes silicon oxide. The dielectric layer 304 may be formed by chemical vapor deposition (CVD), atomic layer deposition (ALD), spin coating, or other suitable process. The conductive feature 306 and the cap layer 308 may each include an electrically conductive material, such as Cu, Co, Ru, Mo, Cr, W, Mn, Rh, Jr, Ni, Pd, Pt, Ag, Au, Al, alloys thereof, or other suitable material. In some embodiments, the conductive feature 306 and the cap layer 308 each includes a metal. The conductive feature 306 may be formed by physical vapor deposition (PVD), CVD, ALD, or other suitable process. The cap layer 308 may be formed by PVD, CVD, ALD, or other suitable process. In some embodiments, the conductive feature 306 has a thickness ranging from about 50 Angstroms to about 500 Angstroms, and the cap layer 308 has a thickness ranging from about 2 Angstroms to about 50 Angstroms. The conductive features 306 may be electrically connected to corresponding conductive contacts 126 (FIG. 1).

As shown in FIG. 2B, a glue layer 310, a conductive layer 312, and a hard mask 314 are formed over the layer 302. In some embodiment, the glue layer 310 is formed on the layer 302, the conductive layer 312 is formed on the glue layer 310, and the hard mask 314 is formed on the conductive layer 312. In some embodiments, the glue layer 310 is not present, and the conductive layer 312 is formed on the layer 302. The glue layer 310 may include a nitride, such as a metal nitride, and may be formed by PVD, CVD, ALD, or other suitable process. In some embodiments, the glue layer 310 includes TiN or TaN. The glue layer 310 may have a thickness ranging from about 2 Angstroms to about 100 Angstroms. The glue layer 310 may provide adhesion between the conductive layer 312 and the cap layer 308 or the conductive feature 306. The conductive layer 312 may include the same material as the conductive feature 306 and may be formed by the same process as the conductive feature 306. The conductive layer 312 may have the same thickness as the conductive feature 306. The hard mask 314 may include SiN, SiON, SiO$_2$, the like, or a combination thereof, and may be formed by CVD, PVD, ALD, spin coating, or other suitable process.

As shown in FIG. 2C, openings 316 are formed in the hard mask 314, the conductive layer 312, and the glue layer 310. Openings 316 may be formed by first patterning the hard mask 314, followed by transferring the pattern of the hard mask 314 to the conductive layer 312 and the glue layer 310. The openings 316 may be formed by any suitable process, such as wet etch, dry etch, or a combination thereof. In some embodiments, the openings 316 are formed by one or more etch processes. The openings 316 separate the conductive layer 312 into one or more portions, such as a plurality of portions. In some embodiments, each portion of the conductive layer 312 is a conductive feature, such as a conductive line. Each opening 316 exposes dielectric surfaces of the hard mask 314 and the dielectric layer 304 and conductive surfaces of the conductive layer 312 and the glue layer 310.

A treatment process may be performed to activate the dielectric surfaces of the hard mask 314 and the dielectric layer 304 in the openings 316. The treatment process may be a plasma treatment process utilizing process gases such as hydrogen gas, ammonia, and/or oxygen-containing gas. The oxygen-containing gas may include oxygen gas, carbon dioxide, or other suitable oxygen-containing gas.

After the treatment process, a first blocking layer 318 is formed on the activated dielectric surfaces of the hard mask 314 and dielectric layer 304, as shown in FIG. 2D. The first blocking layer 318 may include a compound having a silicon or carbon end group to bond with the activated dielectric surfaces. The first blocking layer 318 is not formed on the conductive surfaces of the conductive layer 312 and the glue layer 310. In some embodiments, the first blocking layer 318 includes butyltriethoxysilane, cyclohexyltrimethoxysilane, cyclopentyltrimethoxysilane, dodecyltriethoxysilane, dodecyltrimethoxysilane, decyltriethoxysilane, dimethoxy(methyl)-n-octylsilane, triethoxyethylsilane, ethyltrimethoxysilane, hexyltrimethoxysilane, hexyltriethoxysilane, hexadecyltrimethoxysilane, hexadecyltriethoxysilane, triethoxymethylsilane, trimethoxy(methyl)silane, methoxy(dimethyl)octadecylsilane, methoxy(dimethyl)-n-octylsilane, octadecyltriethoxysilane, triethoxy-n-octylsilane, octadecyltrimethoxysilane, trimethoxy(propyl)silane, trimethoxy-n-octylsilane, triethoxy(propyl)silane, methane, ethane, propane, butane, pentane, hexane, heptane, octane, nonane, decane, undecane, dodecane, pentadecane, hexadecane, or other suitable compound. The first blocking layer 318 may be formed by ALD, CVD, spin-on, dipping, radical reaction through remote plasma, or other suitable process.

As shown in FIG. 2E, a barrier layer 320 is formed on the exposed surfaces of the conductive layer 312 and the glue layer 310 in each opening 316. The barrier layer 320 may be selective formed on the exposed surfaces of the conductive layer 312 and the glue layer 310 but not on the first blocking layer 318. In other words, the first blocking layer 318 blocks the barrier layer 320 from forming on the dielectric surfaces of the dielectric layer 304 and the hard mask 314. The barrier layer 320 may include a nitride, such as a metal nitride. In some embodiments, the barrier layer 320 includes a refractory metal nitride, such as TiN or TaN. The barrier layer 320 may be formed by any suitable process, such as CVD or ALD. Because the barrier layer 320 is not formed on the dielectric layer 304, the portions of the barrier layer 320 formed on adjacent portions of the conductive layer 312 are not connected. Thus, line to line leakage, i.e., leakage between adjacent portions of the conductive layer 312, is reduced.

After the formation of the barrier layer 320, the first blocking layer 318 may be removed. The removal of the first blocking layer 318 may be performed by any suitable process, such as plasma treatment, thermal treatment, or selective plasma etching. As shown in FIG. 2F, a degradable layer 322 is formed in the openings 316 (FIG. 2E) and on the hard mask 314. The degradable layer 322 may include a polymer, such as an organic layer having C, O, N, and/or H. In some embodiments, the degradable layer 322 includes polyurea. The polyurea may be synthesized by reacting diisocyanate and diamine, which is shown below.

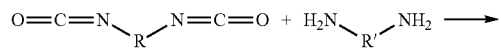

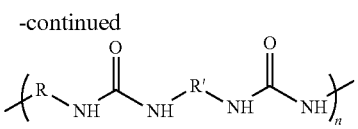

The degradable layer 322 may be formed by any suitable process, such as CVD, ALD, plasma enhanced CVD (PECVD), plasma enhanced ALD (PEALD), or spin-on.

As shown in FIG. 2G, the degradable layer 322 is recessed to a level below the level of a top surface 321 of the conductive layer 312. The recess of the degradable layer 322 may be performed by any suitable process, such as thermal baking, UV curing, an etch-back process (e.g., a plasma etch process), or any combination thereof. In some embodiments, the degradable layer 322 is recessed by a UV curing process that expose the degradable layer 322 to UV energy having an energy density ranging from about 10 mJ/cm$^2$ to about 100 J/cm$^2$. The recess of the degradable layer 322 may partially open the openings 316, as shown in FIG. 2G. In some embodiments, the recess of the degradable layer 322 may expose at least a portion of the barrier layer 320 in the openings 316. The remaining degradable layer 322 may have a height H1 ranging from about 10 Angstroms to about 1000 Angstroms.

As shown in FIG. 2H, a support layer 324 is formed on the exposed surfaces of the interconnection structure 300. In some embodiments, the support layer 324 is formed on the degradable layer 322, the barrier layer 320, and the hard mask 314. The support layer 324 may include Si, O, N, or any combinations thereof. In some embodiments, the support layer 324 includes SiO, SiCO, SiNO, SiCN, or SiCON. The support layer 324 may be porous in order to allow UV energy, thermal energy, or plasma, etc., to reach the degradable layer 322 disposed therebelow. The support layer 324 may have a thickness ranging from about 2 Angstroms to about 100 Angstroms. The support layer 324 may be formed by any suitable process, such as PVD, CVD, ALD, PECVD, or PEALD. In some embodiments, the support layer 324 is a conformal layer formed by ALD or PEALD. The term "conformal" may be used herein for ease of description upon a layer having substantial same thickness over various regions.

As shown in FIG. 2I, the degradable layer 322 is removed, forming an air gap 326 in each opening 316 below the support layer 324. The removal of the degradable layer 322 may be a result of degradation or decomposition of the degradable layer 322. The decomposition or degradation of the degradable layer 322 may be performed by any suitable process, such as thermal baking and/or UV curing. In some embodiments, an UV curing process is performed to remove the degradable layer 322. The UV energy may pass through the porous support layer 324 to reach and remove the degradable layer 322. The UV energy may have an energy density ranging from about 10 mJ/cm$^2$ to about 100 J/cm$^2$. The removal of the degradable layer 322 does not substantially affect the other layers of the interconnection structure 300. The air gap 326 may have the height H2, which is the same as the height H1 of the degradable layer 322 shown in FIG. 2G. The air gap 326 may reduce capacitive coupling between neighboring portions of the conductive layer 312. If the height H2 is less than about 10 Angstroms, the air gap 326 may not provide reduced capacitive coupling between neighboring portions of the conductive layer 312. On the other hand, if the height H2 is greater than about 1000 Angstroms, the support layer 324 may not have enough contact on the barrier layer 320 to prevent materials subsequently formed on the support layer 324 from collapsing into the air gap 326.

As shown in FIG. 2J, a dielectric material 328 is formed on the support layer 324. The dielectric material 328 may be a silicon-containing material, such as SiCO, SiCN, SiN, SiCON, $SiO_x$, SiC, or SiON. In some embodiments, the dielectric material 328 includes a low-k dielectric material, such as SiCOH, having a k value ranging from about 2 to about 3.6. The low-k dielectric material may have a porosity ranging from about 0.1 percent to about 40 percent. The dielectric material 328 may fill the portion of the openings 316 (FIG. 2I) over the support layer 324 and the air gap 326 and may be formed over the hard mask 314, as shown in FIG. 2J. The dielectric material 328 may be formed by CVD, ALD, PECVD, PEALD, or other suitable process.

As shown in FIG. 2K, a planarization process may be performed to remove a portion of the dielectric material 328 formed over the conductive layer 312. The hard mask 314 and the portion of the support layer 324 disposed on the hard mask 314 may be also removed as a result of the planarization process. The planarization process may be any suitable process, such as a chemical-mechanical polishing (CMP) process. As a result of the planarization process, a top surface 330 of the conductive layer 312 may be substantially co-planar with a top surface 332 of the dielectric material 328. The remaining dielectric material 328 may have a thickness ranging from about 2 Angstroms to about 1000 Angstroms. The support layer 324 and the dielectric material 328 prevent the materials introduced during the planarization process, for example the slurry, from entering the air gaps 326. After the planarization process, a cap layer 334 may be selectively formed on the top surface 330 of the conductive layer 312. The cap layer 334 may include the same material as the cap layer 308. For example, the cap layer 334 includes a metal. The cap layer 334 may be formed by the same process as the cap layer 308. The cap layer 334 may be selectively formed on the top surface 330, which may be metallic, but not on the top surface 332 of the dielectric material 328.

A treatment process may be performed to activate the metallic surfaces of the cap layer 334. The treatment process may be a plasma treatment process utilizing process gases such as hydrogen gas, ammonia, and/or oxygen-containing gas. The oxygen-containing gas may include oxygen gas, carbon dioxide, or other suitable oxygen-containing gas. After the treatment process, a second blocking layer 336 is formed on the activated metallic surfaces of the cap layers 334, as shown in FIG. 2L. The second blocking layer 336 may include a compound having a phosphorus (P), sulfur (S), silicon (Si), or nitrogen (N) end group to bond with the treated metallic surfaces. The second blocking layer 336 is not formed on the dielectric surfaces of the dielectric material 328 and the support layer 324. The second blocking layer 336 may not be formed on the barrier layers 320. In some embodiments, the second blocking layer 336 includes 1-octadecanethiol, 1-dodecanethiol, stearic acid, 4-dodecylbenzenesulfonic acid, dimethyl octadecylphosphonate, bi(dodecyl) dithiophosphinic acids, bi(octadecyl) dithiophosphinic acids, diethyl-n-octadecylphosphonate, octadecylphosphonic acid, decylphosphonic acid, tetradecylphosphonic acid, 2-mercaptobenzothiazole, 2-mercaptobenzoxazole, 2-mercaptobenzimidazole, benzothiazol, benzoxazole, benzimidazole, 2-methylbenzimidazole, 5,6-dimethylbenzimidazole, 2-(methylthio)benzimidazole, 1,2,3-triazole, 1,2,4-triazole, 3-amino-1,2,4-triazole, 1-hydroxybenzotriazole hydrate, 4-methyl-1H-benzotriazole, 5-methyl-1H-benzotriazole, 5,6-dimethyl-1H-benzotriazole, 4-hydroxy-1H-benzotriazole, benzotriazole-1-carboxamide, 2-methylbenzothiazole, imidazole, methimazole, 5-phenyl-1H-tetrazole, benzotriazole, 5-(3-aminophenyl) tetrazole, 4-amino-4H-1,2,4-triazole, 3-amino-5-mercapto-1,2,4-triazole, 3-amino-5-methylthio-1H-1,2,4-triazole, 2-aminopyrimidine, 2-mercaptopyrimidine, adenine, hypoxanthine, morpholine, 5-amino-1,3,4-thiadiazole-2-thiol, tryptophan, histidine, 5-(trifluoromethyl)-1H-1,2,3-benzotriazole, 1H-benzotriazole,1-(4-morpholinylmethyl), phenothiazine, purine, melamine, trithiocyanuric acid, 1,3,4-thiadiazole-2,5-diamine, 3,5-diamino-1,2,4-triazole, 5-aminotetrazole, 3,6-bis(methylthio)-1,2,4,5-tetrazine, aminophylline, or other suitable compound. The second blocking layer 336 may be formed by ALD, CVD, spin-on, dipping, or other suitable process. The second blocking layer 336 may have a thickness ranging from about 1 Angstrom to about 50 Angstroms.

As shown in FIG. 2M, a metal oxide layer 338 is formed on the exposed top surfaces 332 of the dielectric material 328 and the exposed surfaces of the support layer 324 and barrier layer 320. The metal oxide layer 338 may be selective formed on the exposed dielectric surfaces of the dielectric material 328 and the support layer 324 but not on the second blocking layer 336. In other words, the second blocking layer 336 blocks the metal oxide layer 338 from forming on the metallic surfaces of the cap layer 334. The second blocking layer 336 blocks the precursor(s) of the metal oxide layer 338 from forming thereon, so the precursor(s) of the metal oxide layer 338 grows on the dielectric surfaces, such as the dielectric material 328 and the support layer 324. The metal oxide layer 338 may include a metal, such as Al, Ti, Zr, Hf, Y, or other suitable metal. The metal oxide layer 338 may be formed by any suitable process, such as CVD, ALD, or spin-on. The metal oxide layer 338 extends above the level of the top surface of the portions of the conductive layer 312. The metal oxide layer 338 may have a thickness T1 ranging from about 20 Angstroms to about 100 Angstroms. The metal oxide layer 338 prevents a subsequently formed conductive feature 350 (FIG. 2Q) from entering between the neighboring portions of the conductive layer 312 as a result of an edge placement error (EPE). Thus, if the thickness T1 of the metal oxide layer 338 is less than about 20 Angstroms, the metal oxide layer 338 may not be sufficient to prevent the conductive feature 350 (FIG. 2Q) from entering between the neighboring portions of the conductive layer 312. On the other hand, if the thickness T1 of the metal oxide layer 338 is greater than about 100 Angstroms, manufacturing cost is increased without significant advantage.

As shown in FIG. 2N, the second blocking layer 336 is removed. The removal of the second blocking layer 336 may be performed by any suitable process, such as plasma treatment, thermal treatment, or selective plasma etching. The metal oxide layer 338 has a top surface 339 that may be at a level higher than a top surface 335 of the cap layer 334.

As shown in FIG. 2O, an etch stop layer 340 is formed on the top surface 339 of the metal oxide layer 338 and on the top surface 335 of the cap layer 334. The etch stop layer 340 may be a single layer or a multi-layer structure. In some embodiments, the etch stop layer 340 may be an oxide, such as a metal oxide. For example, the etch stop layer 340 may include Al, Zr, Y, Hf, or other suitable metal. In some embodiments, the etch stop layer 340 includes a silicon-containing material, such as SiCO, SiCN, SiN, SiCON, $SiO_x$, SiC, SiON, or other suitable material. The etch stop layer 340 may include a material different from the metal oxide layer 338 in order to have different etch selectivity compared to the metal oxide layer 338. The etch stop layer 340 may be formed by any suitable process, such as CVD, ALD, spin-on, or any conformal deposition process. The etch stop layer 340 may have a thickness ranging from about 1 Angstrom to about 100 Angstroms.

A dielectric material 342 is formed on the etch stop layer 340, and a hard mask 344 is formed on the dielectric material 342. The dielectric material 342 may include the same material as the dielectric material 328 and may be formed by the same process as the dielectric material 328. The etch stop layer 340 and the dielectric material 342 may have different etch selectivity, and the metal oxide layer 338 and the dielectric material 342 may have different etch selectivity. The hard mask 344 may include the same material as the hard mask 314 and may be formed by the same process as the hard mask 314. An optional etch stop layer (not shown) may be embedded in the dielectric material 342. As shown in FIG. 2P, openings 346, 348 are formed in the hard mask 344 and the dielectric material 342. The openings 346, 348 may be a result of a dual-damascene process. For example, the opening 346 may be first formed by patterning the hard mask 344 and transferring the pattern to a portion of the dielectric material 342. The optional etch stop layer (not shown) embedded in the dielectric material 342 may be utilized in forming the opening 346. The opening 348 is then formed by covering a portion of a bottom of the opening 346. Thus, the opening 348 has smaller dimensions than the opening 346. In some embodiments, the opening 348 is a via and the opening 346 is a trench. The openings 346, 348 may be formed by any suitable processes, such as one or more etch processes. The etch processes also remove a portion of the etch stop layer 340 and the cap layer 334, so the opening 348 exposes a top surface 313 of a portion of the conductive layer 312, as shown in FIG. 2P.

In some embodiments, opening 348 is aligned with a portion of the conductive layer 312, such as the portion of the conductive layer 312 disposed between two air gaps 326. In some embodiments, the opening 348 is slightly misaligned with the portion of the conductive layer 312, and the metal oxide layer 338 is exposed. The misalignment of the via is known as an edge placement error (EPE). If the metal oxide layer 338 is not present, the opening 348 may be also formed in the dielectric material 328, because the dielectric material 342 and the dielectric material 328 may include the same material. As a result, subsequently formed conductive feature may be formed in the dielectric material 328 between the neighboring portions of the conductive layer 312, which may cause line to line leakage. Reliability issues such as poor breakdown voltage or time dependent dielectric breakdown may occur as a result of the line to line leakage. With the metal oxide layer 338 disposed on the dielectric material 328, the etch processes utilized to form the opening 348 do not substantially affect the metal oxide layer 338 due to its different etch selectivity compared to the dielectric material 342 and the etch stop layer 340. Furthermore, as described above, the metal oxide layer 338 extends above the level of the top surface of the portions of the conductive layer 312 and has a thickness ranging from about 20 Angstroms to about 100 Angstroms. Thus, even if the etch processes utilized to form the opening 348 remove some of the metal oxide layer 338, the opening 348 would not be formed in the dielectric material 328 due to the thickness of the metal oxide layer 338. Therefore, with the metal oxide layer 338, the risk of line to line leakage is reduced when EPE occurs.

Figure 2Q:
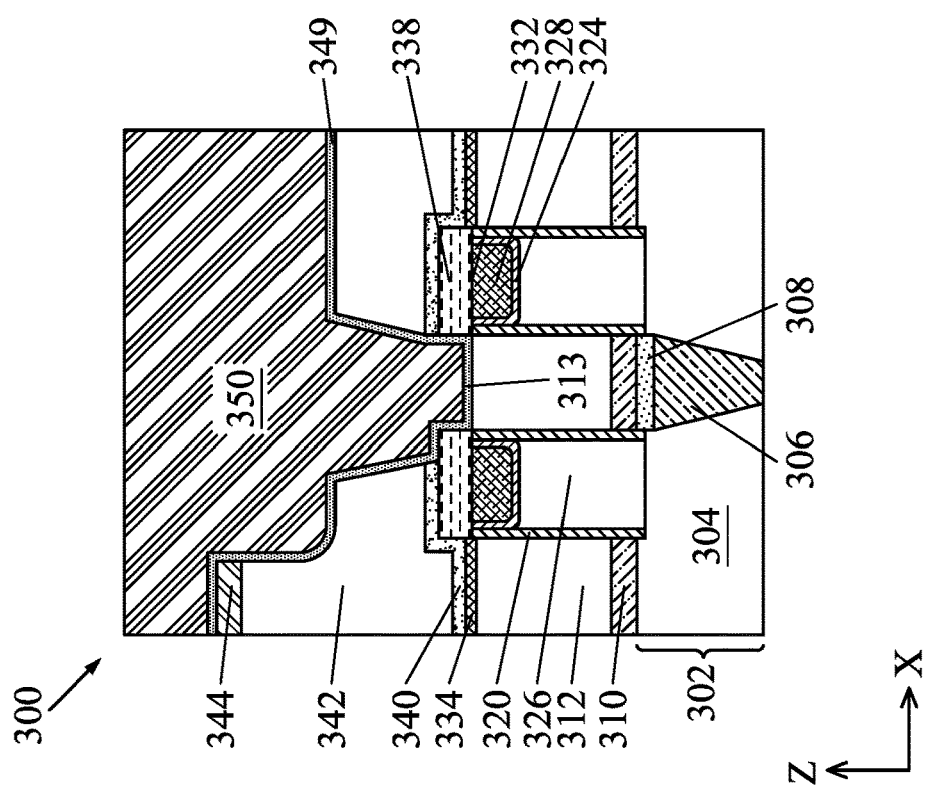

As shown in FIG. 2Q, a barrier layer 349 and a conductive feature 350 are formed in the openings 346, 348. The barrier layer 349 may include Co, W, Ru, Al, Mo, Ti, TiN, TiSi, CoSi, NiSi, Cu, TaN, Ni, or TiSiNi and may be formed by any suitable process, such as PVD, ALD, or PECVD. In some embodiments, the barrier layer 349 may be a conformal layer formed by a conformal process, such as ALD. The conductive feature 350 may include an electrically conductive material, such as a metal. For example, the conductive feature 350 includes Cu, Ni, Co, Ru, Ir, Al, Pt, Pd, Au, Ag, Os, W, Mo, alloys thereof, or other suitable material. The conductive feature 350 may be formed by any suitable process, such as electro-chemical plating (ECP), PVD, CVD, or PECVD. The conductive feature 350 may include a first portion disposed in the opening 348 (FIG. 2P) and a second portion disposed over the first portion. In some embodiments, the first portion of the conductive feature 350 may be a conductive via, and the second portion of the conductive feature 350 may be a conductive line. As described above, the metal oxide layer 338 prevents the conductive feature 350 from forming between the neighboring portions of the conductive layer 312. The conductive feature 350 may be disposed adjacent and over the metal oxide layer 338. In other words, the conductive feature 350 may be disposed adjacent a vertical surface of the metal oxide layer 338 and disposed over a horizontal surface of the metal oxide layer 338.

A planarization process is performed to remove the portion of the barrier layer 349 and the conductive feature 350 disposed over the hard mask 344, and the hard mask 344 may be removed by the planarization process, as shown in FIG. 2R. The planarization process may be any suitable process, such as a CMP process. A cap layer 352 may be selectively formed on the conductive feature 350. The cap layer 352 may include the same material as the cap layer 308. For example, the cap layer 352 includes a metal. The cap layer 352 may be formed by the same process as the cap layer 308. The cap layer 352 may be selectively formed on the conductive feature 350, which may be metallic, but not on the dielectric material 342.

The present disclosure in various embodiments provides separate barrier layers 320 disposed on neighboring portions of the conductive layer 312. An air gap 326 is disposed between neighboring portions of the conductive layer 312, and a support layer 324 and the dielectric material 328 are disposed over the air gap 326. A metal oxide layer 338 is disposed over the dielectric material 328. Some embodiments may achieve advantages. For example, the separate barrier layers 320 may reduce line to line leakage, and the air gap 326 may reduce capacitive coupling between the neighboring portions of the conductive layer 312. In addition, the support layer 324 prevents materials from filling the air gap 326. Furthermore, the metal oxide layer 338 prevents a conductive feature 350 from forming between the neighboring portions of the conductive layer 312, leading to reduced line to line leakage when EPE occurs.

An embodiment is an interconnection structure. The structure includes a dielectric layer, a first conductive feature disposed in the dielectric layer, and a conductive layer disposed over the dielectric layer. The conductive layer includes a first portion and a second portion adjacent the first portion, and the second portion of the conductive layer is disposed over the first conductive feature. The structure further includes a first barrier layer in contact with the first portion of the conductive layer, a second barrier layer in contact with the second portion of the conductive layer, and a support layer in contact with the first and second barrier layers. An air gap is located between the first and second barrier layers, and the dielectric layer and the support layer are exposed to the air gap.

Another embodiment is a structure. The structure includes a device layer and an interconnection structure disposed over the device layer. The interconnection structure includes a dielectric layer, a first conductive feature disposed in the dielectric layer, and a conductive layer disposed over the dielectric layer. The conductive layer includes a first portion and a second portion adjacent the first portion, and the second portion of the conductive layer is disposed over the first conductive feature. The structure further includes a first barrier layer in contact with the first portion of the conductive layer and a second barrier in contact with the second portion of the conductive layer. The first and second barrier layers are separated by an air gap. The structure further includes a first dielectric material disposed over the air gap, and the first dielectric material includes a surface substantially co-planar with a surface of the second portion of the conductive layer. The structure further includes a metal oxide layer disposed on the surface of the first dielectric material and a second conductive feature disposed over the surface of the second portion of the conductive layer. The second conductive feature is disposed adjacent and over the metal oxide layer.

A further embodiment is a method. The method includes forming a conductive layer over a dielectric layer and forming one or more openings in the conductive layer to expose portions of the dielectric layer. The one or more openings separates the conductive layer into one or more portions. The method further includes forming a first blocking layer on the exposed portions of the dielectric layer, forming barrier layers in contact with the portions of the conductive layer, removing the first blocking layer, forming a degradable layer in each of the one or more openings, forming a support layer in each of the one or more openings, removing the degradable layer to form an air gap in each of the one or more openings, forming a first dielectric material on the support layer, forming a cap layer on each portion of the conductive layer, forming a second blocking layer on each cap layer, forming a metal oxide layer on the first dielectric material, and removing the second blocking layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. An interconnection structure, comprising:
a dielectric layer;
a first conductive feature disposed in the dielectric layer;
a conductive layer disposed over the dielectric layer, wherein the conductive layer includes a first portion and a second portion adjacent the first portion, and the second portion of the conductive layer is disposed over the first conductive feature;
a first barrier layer in contact with the first portion of the conductive layer;
a second barrier layer in contact with the second portion of the conductive layer; and
a support layer in contact with the first and second barrier layers, wherein an air gap is located between the first and second barrier layers, and the support layer is a continuous layer disposed over the air gap.

2. The interconnection structure of claim 1, wherein the first and second barrier layers each comprises a refractory metal nitride.

3. The interconnection structure of claim 1, further comprising a first dielectric material disposed on the support layer, wherein the first dielectric material includes a surface that is substantially co-planar with a surface of the first portion of the conductive layer.

4. The interconnection structure of claim 3, further comprising a second dielectric material disposed over the first portion of the conductive layer and the first dielectric material.

5. The interconnection structure of claim 4, further comprising a second conductive feature disposed in the second dielectric material, wherein the second conductive feature is disposed over the second portion of the conductive layer.

6. The interconnection structure of claim 1, further comprising a glue layer disposed between the dielectric layer and the conductive layer.

7. A structure, comprising:
a device layer; and
an interconnection structure disposed over the device layer, wherein the interconnection structure comprises:
a dielectric layer;
a first conductive feature disposed in the dielectric layer;
a conductive layer disposed over the dielectric layer, wherein the conductive layer includes a first portion and a second portion adjacent the first portion, and the second portion of the conductive layer is disposed over the first conductive feature;
a first barrier layer in contact with the first portion of the conductive layer;
a second barrier layer in contact with the second portion of the conductive layer, wherein the first and second barrier layers are separated by an air gap;
a first dielectric material disposed over the air gap, wherein the first dielectric material includes a surface substantially co-planar with a surface of the second portion of the conductive layer;
a metal oxide layer disposed on the surface of the first dielectric material; and
a second conductive feature disposed over the surface of the second portion of the conductive layer, wherein the second conductive feature is disposed adjacent and over the metal oxide layer.

8. The structure of claim 7, wherein the interconnection structure further comprises a first cap layer disposed on the first conductive feature.

9. The structure of claim 8, wherein the interconnection structure further comprises a glue layer disposed on the first cap layer, wherein the second portion of the conductive layer is disposed on the glue layer.

10. The structure of claim 9, wherein the interconnection structure further comprises a second cap layer disposed on the first portion of the conductive layer.

11. The structure of claim 10, wherein the interconnection structure further comprises an etch stop layer disposed on the second cap layer and the metal oxide layer.

12. The structure of claim 11, wherein the interconnection structure further comprises a second dielectric material disposed on the etch stop layer, wherein the second conductive feature is disposed in the second dielectric material.

13. The structure of claim 7, wherein the device layer comprises one or more transistors.

14. The structure of claim 13, wherein the one or more transistors comprise a source/drain epitaxial feature.

15. The structure of claim 14, wherein the first conductive feature is electrically connected to the source/drain epitaxial feature.

16. A method, comprising:
    forming a conductive layer over a dielectric layer;
    forming one or more openings in the conductive layer to expose portions of the dielectric layer, wherein the one or more openings separates the conductive layer into one or more portions;
    forming a first blocking layer on the exposed portions of the dielectric layer;
    forming barrier layers in contact with the portions of the conductive layer;
    removing the first blocking layer;
    forming a degradable layer in each of the one or more openings;
    forming a support layer in each of the one or more openings;
    removing the degradable layer to form an air gap in each of the one or more openings;
    forming a first dielectric material on the support layer;
    forming a cap layer on each portion of the conductive layer;
    forming a second blocking layer on each cap layer;
    forming a metal oxide layer on the first dielectric material; and
    removing the second blocking layer.

17. The method of claim 16, further comprising recessing the degradable layer prior to forming the support layer.

18. The method of claim 17, further comprising performing a planarization process after forming the first dielectric material but before forming the cap layer, wherein surfaces of the portions of the conductive layer are substantially co-planar with a surface of the first dielectric material.

19. The method of claim 18, further comprising:
    forming an etch stop layer on the cap layer and the metal oxide layer; and
    forming a second dielectric material on the etch stop layer.

20. The method of claim 19, further comprising forming a conductive feature in the second dielectric material, wherein the conductive feature is disposed adjacent and over one of the metal oxide layer.

* * * * *